United States Patent
Dmitrienko

(10) Patent No.: US 10,910,053 B2
(45) Date of Patent: Feb. 2, 2021

(54) METHOD OF EXCHANGING DATA WITH MEMORY CELLS

(71) Applicants: Vjacheslav Alekseevich Kosuhin, Nikolaev (UA); Vladimir Grigor'evich Dmitrienko, Nikolaev (UA)

(72) Inventor: Vladimir Grigor'evich Dmitrienko, Nikolaev (UA)

(73) Assignees: Vladimir Grigor'evich Dmitrienko, Nikolaev (UA); Vjacheslav Alekseevich Kosuhin, Nikolaev (UA)

( * ) Notice: Subject to any disclaimer, the term of this patent is extended or adjusted under 35 U.S.C. 154(b) by 0 days.

(21) Appl. No.: 15/780,554

(22) PCT Filed: Oct. 21, 2016

(86) PCT No.: PCT/IB2016/001796
§ 371 (c)(1),
(2) Date: May 31, 2018

(87) PCT Pub. No.: WO2017/098319
PCT Pub. Date: Jun. 15, 2017

(65) Prior Publication Data
US 2018/0350435 A1 Dec. 6, 2018

(30) Foreign Application Priority Data
Dec. 11, 2015 (RU) ................. 2015148643

(51) Int. Cl.
*G11C 13/04* (2006.01)
*G06F 12/02* (2006.01)

(52) U.S. Cl.
CPC ........ *G11C 13/048* (2013.01); *G06F 12/0246* (2013.01)

(58) Field of Classification Search
CPC ............................................ G11C 11/1675
(Continued)

(56) References Cited

U.S. PATENT DOCUMENTS

2004/0120246 A1* 6/2004 Park .................. G11B 11/002
 369/126
2010/0097858 A1 4/2010 Tokiwa et al.
(Continued)

OTHER PUBLICATIONS

Y. Bai et al., "Study of Multi-level Characteristics for 3D Vertical Resistive Switching Memory," Jul. 22, 2014, pp. 1-7 [online] [retrieved from https://www.nature.com/articles/srep05780 on Sep. 3, 2018].

(Continued)

*Primary Examiner* — Min Huang
(74) *Attorney, Agent, or Firm* — Dmitry S. Kryndushkin

(57) ABSTRACT

A method of switching a cell of a memory that consists of cell components formed in a three-dimensional crystal with their own electrical connections and logical cell switching circuits, said method involving the exchange of data with the cells, wherein said exchange is carried out simultaneously with the aid of logical switching circuits and a focused stream of charged particles or electromagnetic radiation, which is directed at one or several of the faces of the crystal onto which a portion of mutually perpendicular electrical connection lines exit. The method simplifies cell switching and does not necessitate switching circuits on all of the faces of a three-dimensional crystal.

1 Claim, 1 Drawing Sheet

(58) Field of Classification Search
USPC .................................................. 365/185.18
See application file for complete search history.

(56) References Cited

U.S. PATENT DOCUMENTS

2013/0075844 A1\* 3/2013 Miyano ............... H01L 27/2409
　　　　　　　　　　　　　　　　　　　　　　257/421
2016/0188495 A1\* 6/2016 Naeimi ............... G06F 12/0246
　　　　　　　　　　　　　　　　　　　　　　711/103

OTHER PUBLICATIONS

Detinich, Gennady, "Samsung for about a year sold the SSD to 3D V-NAND at a loss," Aug. 8, 2015 [online] [retrieved from www.3dnews.ru/918582 on Sep. 3, 2018].

\* cited by examiner

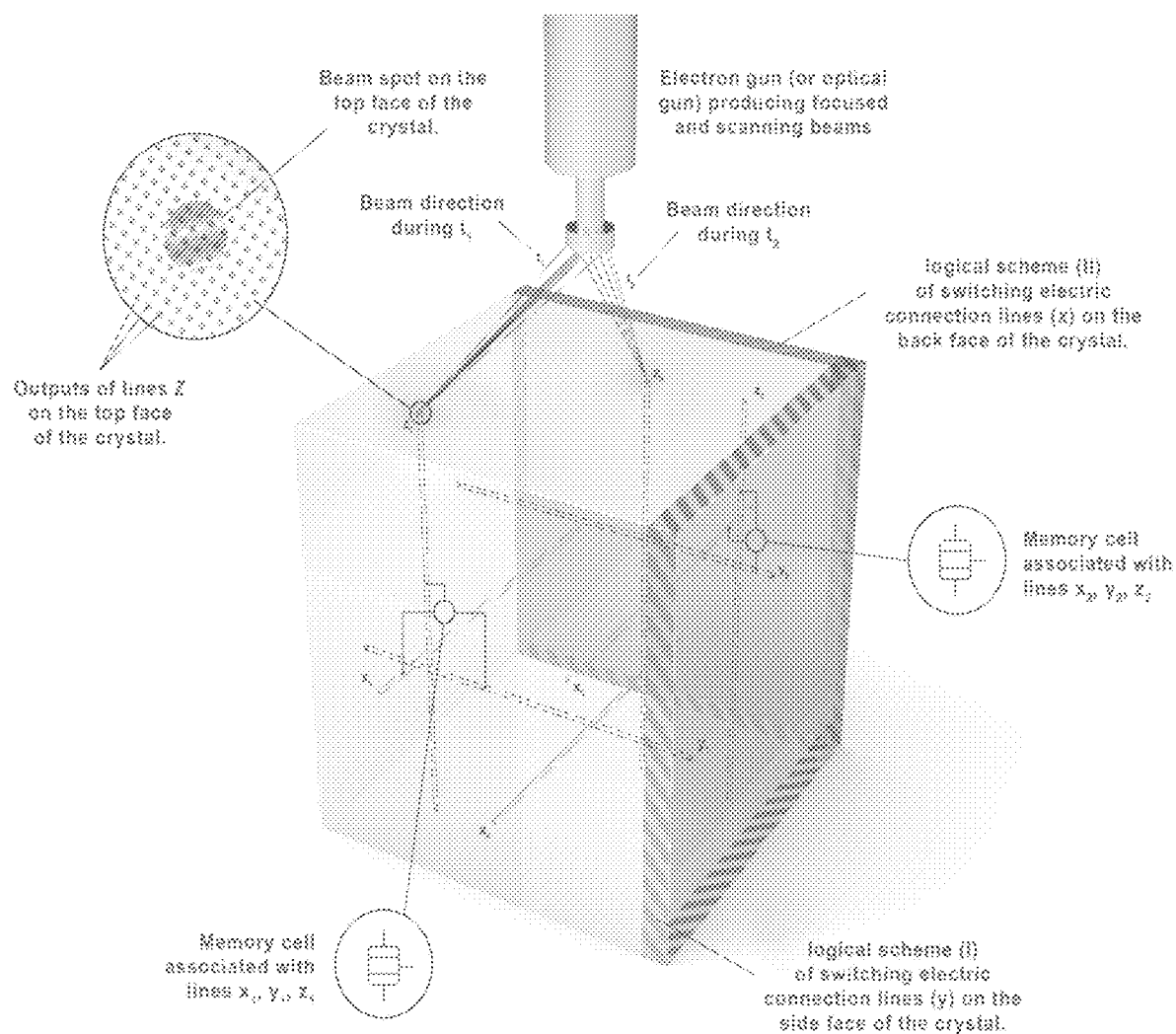

METHOD OF EXCHANGING DATA WITH MEMORY CELLS

The instant application is a national phase of PCT International Application No. PCT/M2016/001796 filed Oct. 21, 2016, and claims priority to Russian Patent Application Serial No. 2015148643 filed Dec. 11, 2015, the entire specifications of both of which are expressly incorporated herein by reference.

FIELD OF THE INVENTION

The invention relates to the field of electronic devices for storage of information and can also be applied in processors or other computer devices, telecommunication networks and separate databases.

BACKGROUND

Leading memory chip production companies such as Samsung and SanDisk have begun to manufacture flash memory of the new generation 3D Vertical NAND (V-NAND), Intel has begun to produce three-dimensional chips with a multilayer three-dimensional structure being a characteristic feature (http://compulenta.computerra.ru/tehnika/microelectronics/10011567/; http://www.cyberser-curity.ru/hard/122063.html; www.3dnews.ru/918582).

The known new technology consists in arranging the chips vertically. This makes it possible to obtain the three-dimensional structure of a microchip, hence greatly augment the amount of the stored information and chip elements per unit of area. A serious shortcoming of such multilayer structures consists in a sharp increase, as the quantity of the layers grows, in the density of the electric lines that connect the separate cells and layers with the logical schemes of the switching, which restricts the growth of the quantity of the layers and, consequently, the augmentation of the amounts of memory and the number of the chip elements.

SUMMARY OF THE INVENTION

The technical result of the claimed invention consists in simplification of switching the memory cells.

The claimed technical result is achieved through a method for switching the memory cells that consist of memory cell elements formed in a three-dimensional multilayer chip with their electrical connections that go out to the chip facets and with the logical schemes of switching the cells, characterized in that the logical schemes of the switching have been formed on one or several facets of the chip and the schemes communicate with the connection lines that go out to the respective facets of the chip; the memory cells are switched by simultaneously using the logical schemes of the switching and a focused modulated flow of charged particles or electromagnetic radiation that is directed at one or several facets of the chip whereto some electric connection lines go out to and that scans the chip surface according to a preset program to choose a needed memory cell element.

BRIEF DESCRIPTION OF THE DRAWINGS

FIG. 1. Three-dimensional multilayer crystal, comprising elements of memory cells. Memory cells are formed at each junction of three electric connecting lines X, Y, Z (X1, X2, X3 . . . Xn; Y1, Y2, Y3 . . . Yn; Z1, Z2, Z3 Zn), that pass mutually perpendicular through the crystal, are not shorted to each other, and overlooking the corresponding crystal facets. X lines go out to the front and back facets of the crystal, Y lines go out to the left and right facets. The connecting Z lines form vertical columns that run through all the horizontal layers and extend to the bottom and top facets of the crystal. A logical scheme (II) for switching connecting lines X is formed on the rear facet of the crystal. On the right facet of the crystal, a logical scheme (I) for switching connecting lines Y is formed. The electron gun scans the top facet of the crystal with a focused beam of charged particles or photons, where the connecting lines Z emerge. Two beams of charged particles are shown at different times t1 and t2. At t1, the beam of particles falls on the upper facet of the crystal in the region of the exit of the connecting line Z1, simultaneously irradiating many endings of Z lines adjacent to Z1. On the other facets, the logical circuit (II) for switching the connecting lines X and the logical circuit (I) switching the connecting lines Y select precisely defined horizontal columns, in this case, X1 Y1 and switch a specific cell of the crystal located at the junction of the lines X1 Y1 Z1. At time t2, beam of charged particles falls on the upper facet of the crystal in the region of the exit of the connecting line Z3.

DETAILED DESCRIPTION OF THE INVENTION

The presented method is implemented as follows.

This invention proposes a method for switching chip cells formed with their mutually perpendicular connection lines in the three-dimensional space so that the connection lines form horizontal rows and columns in each layer and vertical columns that go across all the layers (FIG. 1). And in each junction where the three connection lines cross there are elements of a cell the contacts of which are joined to their connection lines respectively. For example, the gate of a cell to the vertical column, the cell entrance to the horizontal row and the cell exit to the horizontal column. And all the connection lines run through the whole chip within its volume and go out to the surface of a facet of the chip. On one or several facets, the logical schemes of the switching are formed that enable the connection lines going to the respective facets of the chip. A focused flow of charged particles, for example, electrons, or electromagnetic radiation, for example, a flow of photons, falls onto other facets of the chip and closes the circuit. By means of the focused ray, the source of the particles or electromagnetic radiation scans the chip facet surface according to the preset program, thus choosing a needed, for example, vertical column or an entire array of columns. On other facets of the chip, the logical schemes of the switching choose precisely determined horizontal columns, rows and layers and switch a particular cell of the chip. In such a way the cell data are read or recorded, or the cell is directly controlled, depending on the level of the current in the connection lines.

Thus, the claimed method makes it possible to avoid augmentation of the density of the electrical connections when increasing the quantity of the layers and considerably simplifies switching the cells of three-dimensional chips.

The invention claimed is:

1. A method for switching memory cells in a three-dimensional multilayer chip that contains memory cell elements formed with their electrical connection lines that go out to the chip facets and logical schemes of switching the cells, wherein the connection lines form horizontal rows and columns in each layer and vertical columns that go across all the layers, the method comprising the following steps:

forming logical schemes of switching on one or more facets of the chip, wherein said schemes communicate with the electrical connection lines that go out to the respective facets of the chip;

performing switching of the memory cells by simultaneously using the logical schemes of the switching and a focused modulated flow of charged particles or photons that is directed at one or several facets of the chip whereto some electric connection lines go out to and that scans the chip surface according to a preset program to choose a needed memory cell element.

\* \* \* \* \*